United States Patent
Parkin et al.

(10) Patent No.: US 9,583,212 B2
(45) Date of Patent: Feb. 28, 2017

(54) DOMAIN WALL INJECTOR DEVICE USING FRINGING FIELDS AIDED BY SPIN TRANSFER TORQUE

(71) Applicant: INTERNATIONAL BUSINESS MACHINES CORPORATION, Armonk, NY (US)

(72) Inventors: Stuart P. Parkin, San Jose, CA (US); Timothy Phung, Milpitas, CA (US); Aakash Pushp, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 284 days.

(21) Appl. No.: 14/466,904

(22) Filed: Aug. 22, 2014

(65) Prior Publication Data

US 2016/0056368 A1    Feb. 25, 2016

(51) Int. Cl.
*H01L 21/00* (2006.01)
*G11C 19/08* (2006.01)

(52) U.S. Cl.
CPC ...... *G11C 19/0808* (2013.01); *G11C 19/0841* (2013.01); *G11C 19/0875* (2013.01)

(58) Field of Classification Search
CPC ............ G11C 19/0808; G11C 19/0875; G11C 19/0841; H01L 43/02; H01L 43/08; H01L 43/10; H01L 43/12
USPC ............................................................ 438/3
See application file for complete search history.

(56) References Cited

U.S. PATENT DOCUMENTS

| | | | |
|---|---|---|---|
| 8,102,691 B2 | 1/2012 | Xi et al. | |
| 8,223,532 B2 | 7/2012 | Wang et al. | |
| 8,565,011 B2 | 10/2013 | Fukami et al. | |
| 8,687,415 B2 | 4/2014 | Parkin et al. | |
| 2006/0120132 A1* | 6/2006 | Parkin | G11C 11/14 365/80 |
| 2008/0253161 A1* | 10/2008 | Parkin | G11C 11/14 365/80 |
| 2011/0007559 A1* | 1/2011 | Lee | B82Y 10/00 365/171 |
| 2011/0090730 A1* | 4/2011 | Tsai | G11C 19/0841 365/80 |
| 2011/0157955 A1* | 6/2011 | Hung | G11C 19/0808 365/80 |
| 2012/0250406 A1* | 10/2012 | Morise | G11C 11/16 365/173 |
| 2013/0082798 A1 | 4/2013 | Wang et al. | |

(Continued)

OTHER PUBLICATIONS

Cowburn et al. "Domain wall injection and propagation in planar Permalloy nanowires", Journal of Applied Physics, vol. 91, No. 10, pp. 6949-6951, May 2012.

(Continued)

*Primary Examiner* — Trung Q Dang
(74) *Attorney, Agent, or Firm* — Daniel E. Johnson

(57) ABSTRACT

A domain wall injector device uses electrical current passed across an interface between two magnetic regions whose magnetizations are aligned non-collinearly to create a domain wall or a series of domain walls in one of the magnetic regions. The method relies on a combination of innate fringing fields from the magnetic regions and the spin-transfer torque derived from the charge current. The device may be used to store data that are subsequently read out.

27 Claims, 14 Drawing Sheets

(56) References Cited

U.S. PATENT DOCUMENTS

2013/0250668 A1* 9/2013 Fukuzawa ............ G11C 11/161
 365/158

OTHER PUBLICATIONS

Franken et al. "Shift registers based on magnetic domain wall ratchets with perpendicular anisotropy", Nature Nanotechnology, vol. 7, pp. 499-503, Aug. 2012.
Hayashi et al. "Current-controlled magnetic domain-wall nanowire shift register", Science, vol. 320, pp. 209-211, Apr. 2008.
Jia et al. "Chargeless Spin Current for Switching and Coupling of Domain Walls in Magnetic Nanowires", Condensed Matter, Mesoscale and Nanoscale Physics, Cornell University Library, arXiv:1310.2331 [cond-mat.mes-hall], arXiv.org, pp. 1-13, Oct. 2013.
Shigeto et al. "Injection of a magnetic domain wall into a submicron magnetic wire", Applied Physics Letters, vol. 75, No. 18, pp. 2815-2817, Nov. 1999.
Shiota et al. "Induction of coherent magnetization switching in a few atomic layers of FeCO using voltage pulses", Nature Materials, pp. 1-5, Nov. 2011.
Thomas et al. "Observation of injection and pinning of domain walls in magnetic nanowires using photoemission electron microscopy", Applied Physics Letters, vol. 87, No. 262501-3, Dec. 2005.
Wang et al. "Electric-field-assisted switching in magnetic tunnel junctions", Nature Materials, pp. 1-5, Nov. 2011.

* cited by examiner

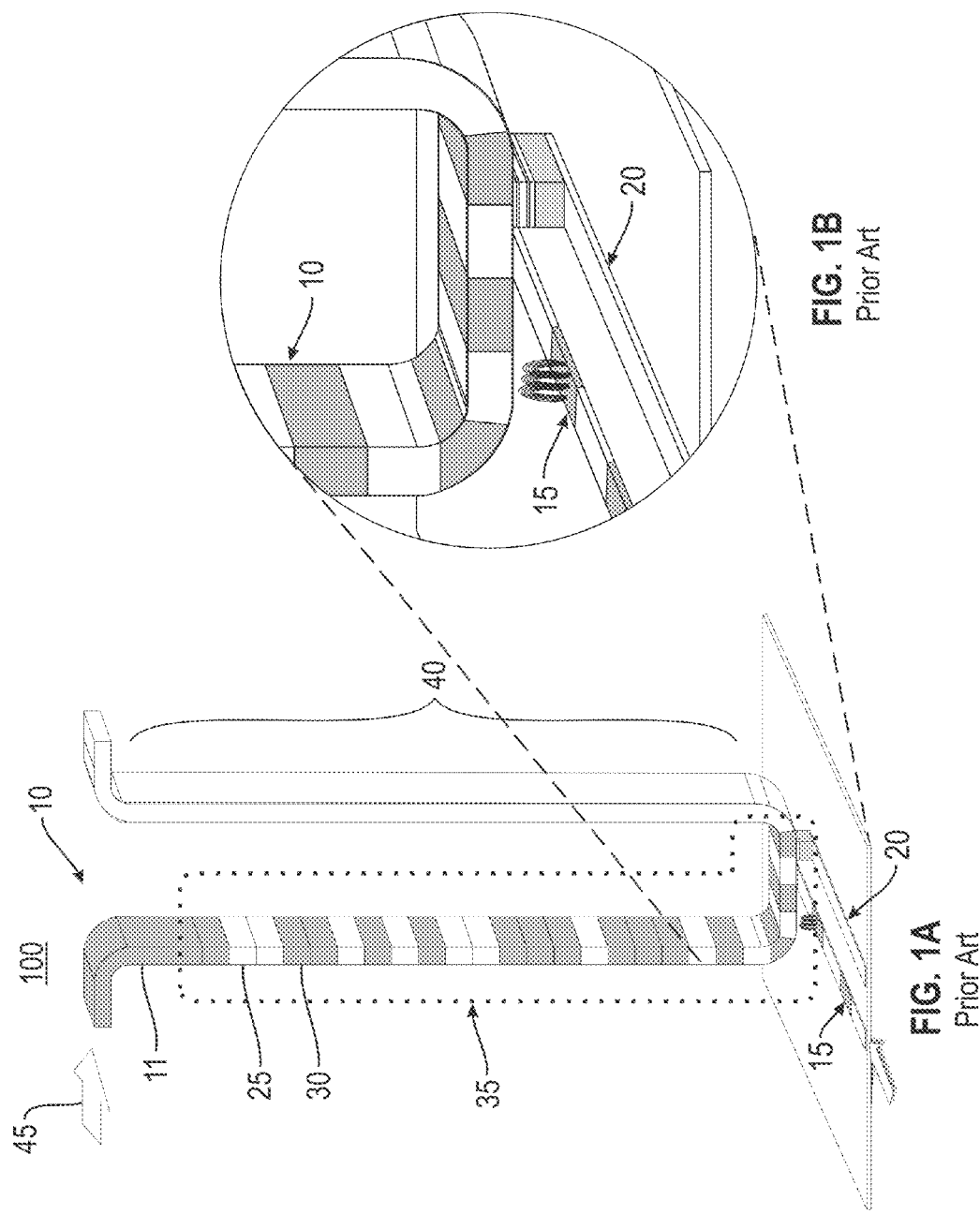

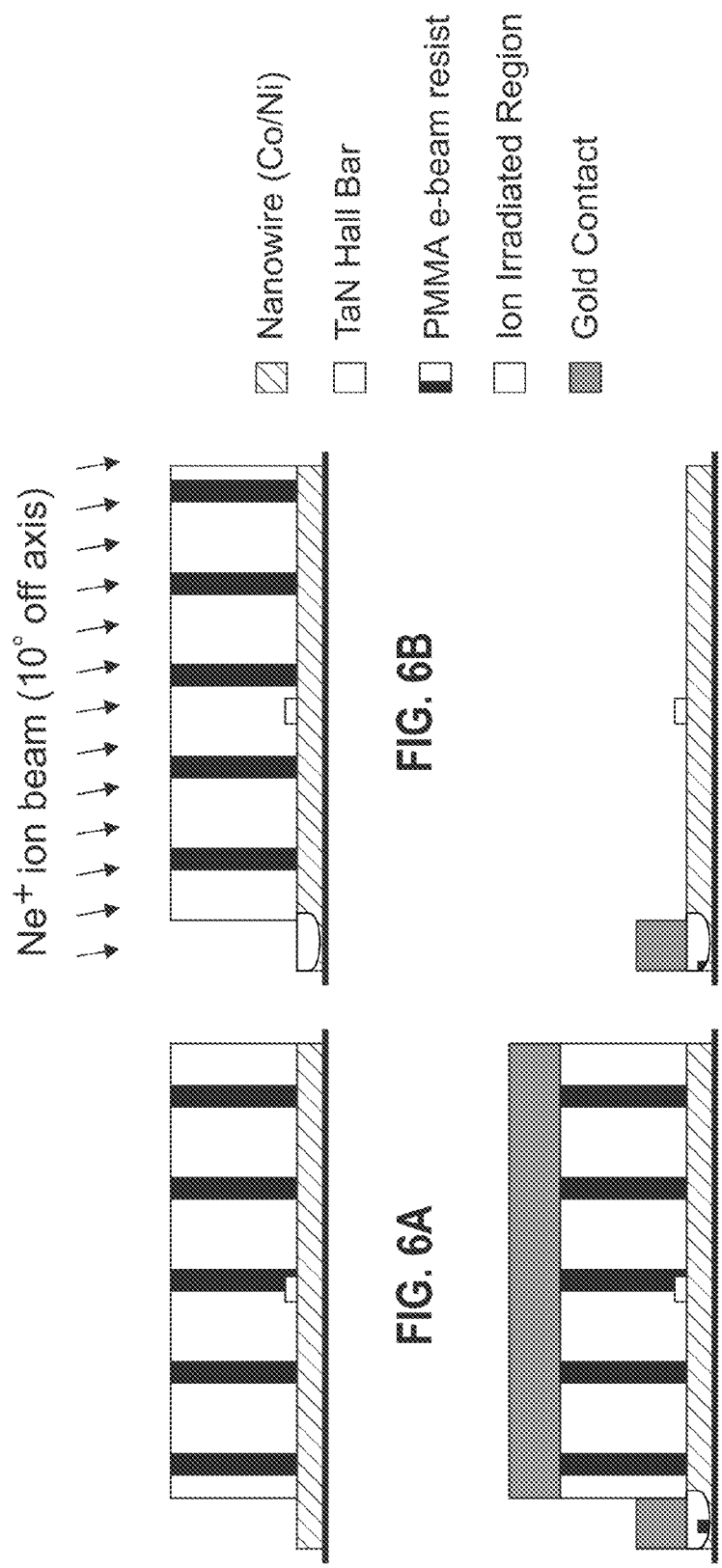

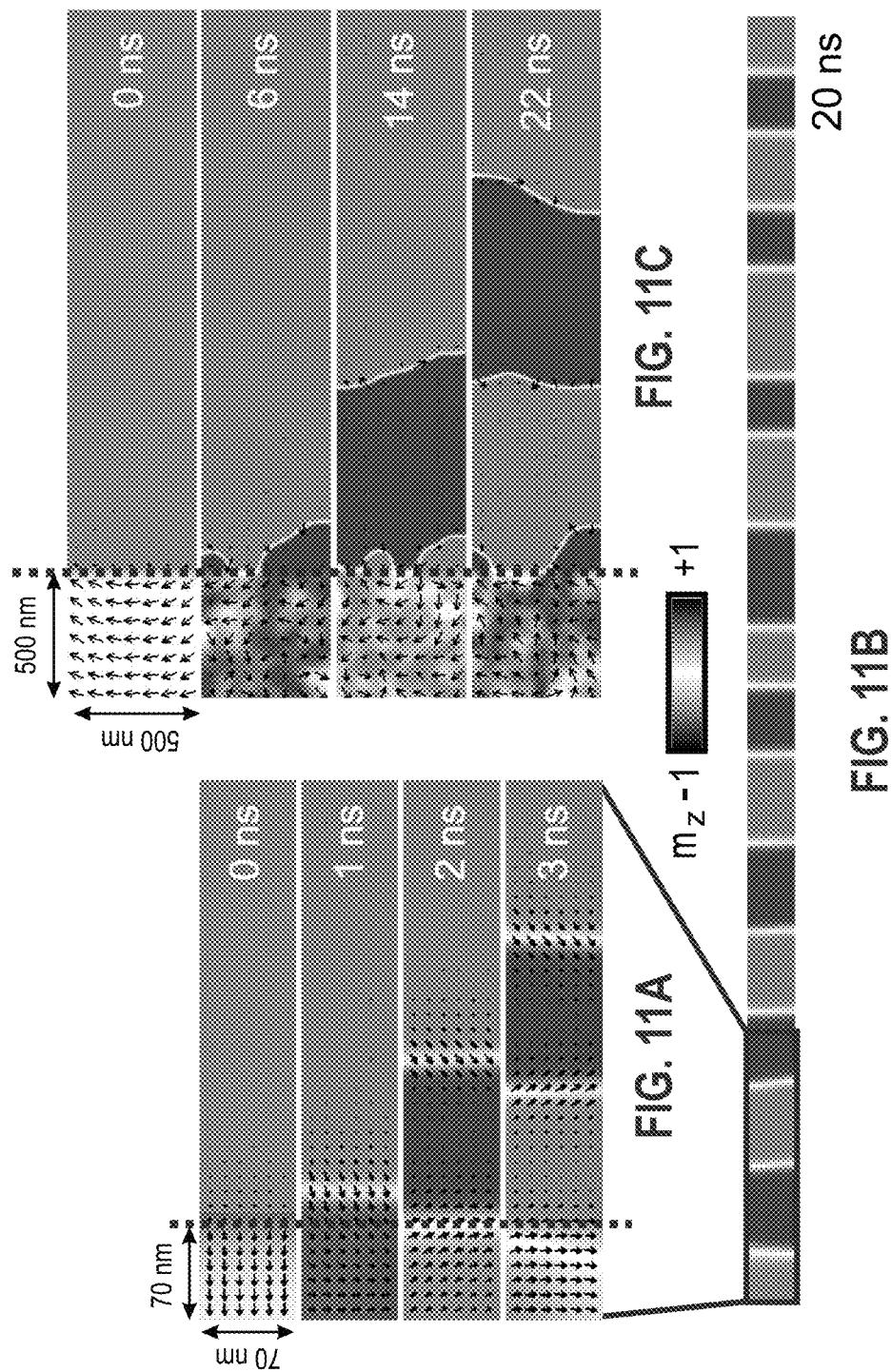

DOMAIN WALL INJECTOR DEVICE USING FRINGING FIELDS AIDED BY SPIN TRANSFER TORQUE

This invention was made with Government support under W911NF-13-1-0107 awarded by the Army Research Office. The Government has certain rights in this invention.

TECHNICAL FIELD

The invention relates to creating domain walls associated with magnetic domains, and more particularly, to the use of such technology in a magnetic racetrack device.

BACKGROUND

Racetrack memory is a memory storage device that stores data in the form of magnetic domain walls that separate magnetic regions magnetized in oppositely oriented directions (for example, see U.S. Pat. Nos. 6,834,005, 6,920,062, 7,551,469 and 8,638,601 to Parkin and co-workers, which are hereby incorporated by reference). As described in these patents, FIG. 1 (FIGS. 1A and 1B) illustrates an exemplary high-level architecture of a magnetic memory system 100 comprising a magnetic shift register 10 that utilizes a writing device (also referred to herein as writing element) 15 and a reading device (also referred to herein as reading element) 20. Both the reading device 20 and the writing device 15 form a read/write element of system 100.

The magnetic shift register 10 comprises a fine track 11 made of ferromagnetic material. The track 11 can be magnetized in small sections, or domains, in one direction or another. Information is stored in regions such as domains 25, 30 in the track 11. The order parameter of the magnetic material from which the track is fabricated, that is, the magnetization direction or the direction of the magnetic moment, changes from one direction to another. This variation in the direction of the magnetic moment forms the basis for storing information in the track 11. In one embodiment, the magnetic shift register 10 comprises a data region 35 and a reservoir 40. The data region 35 comprises a contiguous set of domains such as domains 25, 30 that store data. Additional length is provided to the magnetic shift register 10 in the form of a reservoir 40.

The reservoir 40 is made sufficiently long so that it accommodates all the domains in the region 35 when these domains are moved completely from region 35 across the writing and reading elements for the purposes of writing and reading domains into region 40. At any given time, the domains are thus stored partially in region 35 and partially in region 40, so it is the combination of region 35 and region 40 that forms the storage element. In one embodiment, the reservoir 40 is devoid of magnetic domains in a quiescent state.

Thus, the storage region 35 at any given time may be located within a different portion of the magnetic shift register 10 and the reservoir 40 would be divided into two regions on either side of the storage region 35. Although the storage region 35 is one contiguous region, and in one embodiment of this application the spatial distribution and extent of the domains within the storage region 35 would be approximately the same no matter where the storage region 35 resides within the shift register 10, in another embodiment portions of the storage region may be expanded during the motion of this region particularly across the reading and writing elements. A portion or all of the data region 35 is moved into the reservoir 40 to access data in specific domains.

The reservoir 40 is shown in FIG. 1A as being approximately the same size as the data region 35. However, other alternative embodiments may allow the reservoir 40 to have a different size than the data region 35. As an example, the reservoir 40 could be much smaller than the data region 35 if more than one reading and writing element were used for each magnetic shift register. For example, if two reading and writing elements were used for one shift register and were disposed equally along the length of the data region, then the reservoir would only need to be approximately half as long as the data region.

An electric current 45 is applied to the track 11 to move the magnetic moments within domains 25, 30 along the track 11, past the reading device 20 or the writing device 15. In a magnetic material with domain walls, a current passed across the domain walls moves the domain walls in the direction of the current flow. As the current passes through a domain, it becomes "spin polarized". When this spin polarized current passes through into the next domain across the intervening domain wall, it develops a spin torque. This spin torque moves the domain wall. Domain wall velocities can be very high, i.e., on the order of 100 msec, so that the process of moving a particular domain to the required position for the purposes of reading this domain or for changing its magnetic state by means of the writing element can be very short. The domains are moved (or shifted) back and forth over the writing device 15 and reading device 20, in order to move the data region 35 in and out of the reservoir 40. Additional details regarding racetrack memory can be found in U.S. Pat. Nos. 6,834,005, 6,920,062, 7,551,469 and 8,638,601, for example.

The spin torque that is used to move the domain walls can be generated from several distinct physical phenomena that can be used to generate currents of spin polarized electrons. The most straightforward mechanism is derived from spin-dependent scattering in the interior of the magnetic materials that form the racetrack itself. The scattering rates for majority and minority spin polarized electrons can be very different depending on the detailed composition of the magnetic materials. Another mechanism that generates spin polarized currents is the Spin Hall Effect (SHE) in nominally non-magnetic layers in proximity to the magnetic layers that form the racetrack itself. The SHE is derived from spin orbit coupling in these layers that converts charge currents into pure spin currents that flow in a direction perpendicular to the charge current with a spin polarization direction that is both perpendicular to the current direction and to the spin current direction. These spin currents can give rise to highly efficient motion of domain walls, especially for racetracks that are formed from perpendicularly magnetized materials, via a chiral spin torque mechanism[1-2].

A key principle underlying racetrack memory is the controlled creation[3-5] and manipulation[6-13] of domain walls in magnetic racetracks. This concept is also at the heart of several proposed logic[14-15] and other proposed memory[16] devices. Domain walls are also of interest as artificial traps of magnetic entities including magnetic nano-particles and atoms with magnetic moments such as in ultracold atom gases[17]. These rely on the use of magnetic fringing fields from either magnetic domains or magnetic domain walls to trap and transport the nanoscopic magnetic entities or atoms[17]. The racetracks can in general be formed from two types of magnetic materials, where the magnetization of the magnetic material can be either (i) primarily oriented within the plane of the nanowire or (ii) primarily oriented perpendicular to the plane of the nanowire. Materials of class (i) are typically composed of soft magnetic materials with small intrinsic magneto-crystalline anisotropies compared to the shape magnetic anisotropy derived from magnetostatic energies associated with the dimensions of the nanowire. Materials of class (ii) are typically composed of ultrathin magnetic layers in which their interfaces with non-magnetic layers give rise to interfacial magnetic anisotropies that can result in their magnetization preferring to be oriented perpendicular to these interfaces. For such materials the width of the domain walls decreases as the perpendicular magnetic anisotropy (PMA) is increased and can be as narrow as 0.5-10 nm, whereas in the case of magnetically soft materials (class (i)), the width of the domain walls scales with the width of the racetrack. Thus materials of class (ii) are preferred for the fabrication of dense racetrack memory devices (i.e., devices having high data densities).

The creation (sometimes also referred to as injection) of these domain walls in nanowires entails the controlled reversal of the magnetization in a localized region of the nanowire. Existing techniques for the domain wall injection have been based on the creation of local magnetic fields from nearby contact lines that are typically fabricated orthogonal to the nanowire. Other techniques for domain wall creation have been based on shaping and tuning the properties of the nanowire at a specific location in order to promote the likelihood of magnetization reversal from that section. This allows for the creation of domain walls through the use of a global magnetic field. However, these techniques are not applicable for denser racetrack memory devices, where the placement of many magnetic nanowires in close proximity is required, since individually addressing which magnetic nanowire a domain wall is injected into becomes difficult.

In either of these two cases (i) and (ii), however, the use of local magnetic fields to reverse the magnetization thus requires very large currents while also requiring the addition of several peripheral circuitries, which renders it not useful for dense racetrack memory devices.

SUMMARY

The present invention is directed to creating (or injecting) domain walls with high fidelity and at much lower currents in a smaller footprint than is possible with prior art methods. Of particular interest are applications to memory storage systems in which data are stored in magnetic domain walls or their associated magnetic domains, with magnetic domain walls being created with magnetic fields and then manipulated in a controlled manner by electrical currents.

Preferred embodiments and implementations of the current invention are directed towards the efficient injection of domain walls in materials with perpendicular magnetic anisotropy, which are needed for dense racetrack memory devices. In a preferred embodiment the structure of the domain wall injector device consists of two regions: the "writing region" that has its magnetization easy axis pointing in the plane of the nanowire and the "storage region" with its magnetization easy axis pointing out of the plane of the nanowire.

The mechanism of domain wall injection at the interface between the writing region and the storage region is now described. Near the interface in such a structure, the storage region emanates a fringing magnetic field onto the writing region, which is dependent upon (and opposite in direction to) the magnetization state of the adjacent storage region. In the quiescent state, the magnetization of the writing region stays in-plane, as it is energetically unfavorable for the magnetization to point out-of-plane in this region, despite the presence of the fringing field from the adjacent storage region. This can be described by an energy barrier that confines the magnetization in the plane of the nanowire. However, upon application of an electrical current along the nanowire that gives rise to the spin transfer torque near the interface between the writing and storage regions, this energy barrier can be overcome so that the initially in-plane magnetized writing region can reorient itself to point out-of-plane in the direction of the fringing field it experiences. This leads to the writing region reorienting itself in a direction opposite to the adjacent storage region, thereby leading to the formation of a domain wall, which is then shifted into the storage region via spin transfer torque using the same current pulse used for creating the reversed region in the first place. Thus, a domain wall can be injected into the nanowire, merely by applying current through the cross section of the nanowire, thus making this invention one-dimensional and streamlined. This differs from prior art domain wall injectors that required injection lines to be placed adjacent and orthogonal to the storage regions.

One embodiment of the invention is based on the nanowire having hybrid easy axes. The magnetization in one part of the nanowire, the writing region, is oriented in-plane, and the magnetization in the second part of the nanowire, the storage region, is oriented out of the plane. Such a structure can be formed using the prior-art techniques of ion-bombardment to engineer the magnetic anisotropy of magnetic materials, and it is shown here that by irradiating a small section at the end of a nanowire, the section can indeed be magnetically 'softened' and have its anisotropy reduced. Consequently, this small, irradiated section at the end of the nanowire becomes magnetized in the plane of the nanowire, thereby forming a 90° magnetic interface between the out-of-plane storage region and the in-plane magnetized writing region. By simply injecting current across the 90° magnetic interface, a series of domain walls can be continuously created.

Another aspect of the invention is the use of spin-angular momentum transfer, also known as spin transfer torque, rather than local magnetic fields to introduce a domain wall in the nanowire. In particular, the currents needed for the domain wall injection scheme are at least 2 orders of magnitude smaller than those of conventional methods using localized magnetic fields. A complex interplay between the magnetic regions on either side of this artificially created 90° magnetic interface in the presence of a current induced spin transfer torque results in the controlled and highly efficient injection of a single domain wall or a continuous train of domain walls for longer pulses. Moreover, the same current for injection of a domain wall is also used to synchronously shift the pre-existing domain walls in the nanowire, thereby making this technique highly energy efficient.

One preferred aspect of the invention is a method that includes injecting spin-polarized charge current across an interface between a first magnetic region and a second magnetic region, in which the first and second magnetic regions have non-collinear magnetizations. In so doing, domain walls are created in the second magnetic region that separate respective magnetic domains. The method also includes detecting the orientation of the magnetization of the domains.

Another preferred aspect of the invention is a method that includes injecting spin-polarized charge current into a nanowire having a width of less than 100 nm. The nanowire includes a first magnetic region that adjoins a second magnetic region, with the first magnetic region and the second magnetic region having (i) non-collinear magnetizations and (ii) innate fringing fields. Domain walls are created in the second magnetic region by using spin-transfer torque derived from the current as electrons flow from the first magnetic region into the second magnetic region, in which the domains defined by the domain walls represent data. The method also includes reading out the data by detecting the orientation of the magnetization of the domains.

BRIEF DESCRIPTION OF THE DRAWINGS

FIG. 1, which includes FIGS. 1A and 1B, represents a schematic illustration of an exemplary operating environment in which a magnetic domain wall shift register system of the present invention can be used.

FIG. 2, which includes

FIG. 4, which includes

FIG. 4A shows a prior art configuration that requires a total of three pulsers: two uni-polar pulsers for injection of domain walls and one shift pulser for the shifting of domain walls.

FIG. 4B shows a prior art configuration that uses a single bi-polar pulser for injection of domain walls and a secondary shift pulser for shifting domain walls.

FIG. 6, which includes FIGS. 6A, 6B, 6C, and 6D, shows a process flow for creating (in a magnetic nanowire) lithographically defined in-plane regions, which are also self-aligned to contacts, through use of a broad beam ion source, in which:

FIG. 6A shows an opening being patterned by using e-beam lithography onto an e-beam resist (here: poly(methyl methacrylate) or PMMA), which has been deposited on top of an already existing e-beam patterned device.

FIG. 6B shows the ion beam irradiation step using a broad beam ion source.

FIG. 6C shows the 180 nm thick gold deposition step used for making an electrical contact to the device.

FIG. 6D shows the lift-off of the gold in which an electrical contact is formed.

FIG. 11A presents a time-resolved micromagnetic simulation showing the continuous injection of domain walls observed in narrow nanowires (70 nm wide). The irradiated region is to the left of the dashed lines.

FIG. 11B presents the formation of a series of domain walls after 20 ns of constant electron current flow.

FIG. 11C presents a time-resolved micromagnetic simulation showing the incoherent injection of domain walls within wide nanowires (500 nm wide). The irradiated region is to the left of the dashed lines.

DETAILED DESCRIPTION

Figure 2A:
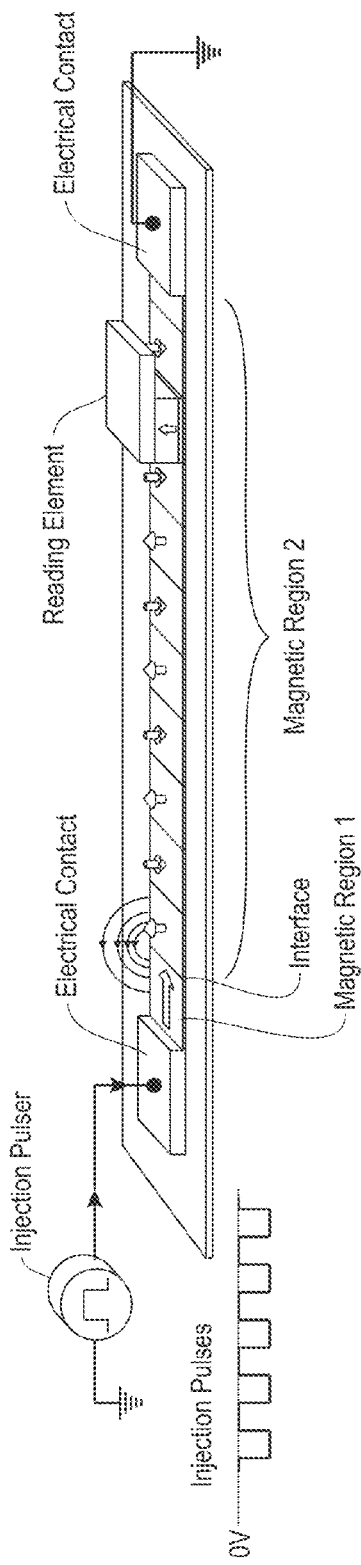
FIGS. 2A and 2B, represents a schematic illustration of a preferred embodiment of the invention, which requires only a single uni-polar pulser. Domain walls can be sequentially injected and shifted across the racetrack memory by a pulse sequence consisting of only injection pulses (FIG. 2A) or by a pulse sequence that is composed of alternating injection and shift pulses (FIG. 2B).
Figure 2B:
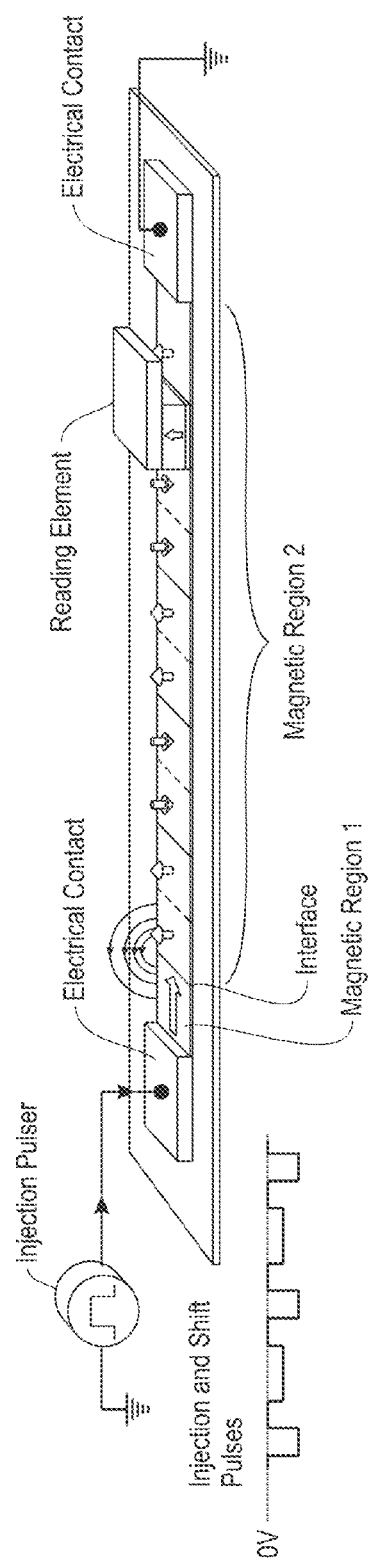

The preferred embodiment of this invention, which is referred to herein as in-line injection (ILI), is shown in FIG. 2A and FIG. 2B. It consists of a magnetic nanowire extending along the length of these figures, where one end of the nanowire, in this case the left hand side (magnetic region 1), has an in-plane easy axis (as indicated by the arrow in magnetic region 1), and the remainder of the nanowire (magnetic region 2) includes various portions, each of which has an easy axis pointing either out-of-plane or into the plane (as indicated by the several arrows in magnetic region 2). Note that the dotted lines in the magnetic region 2 indicate that the domain represents more than one data bit. Electrical contacts are shown and indicated at the ends of the nanowires. These same contacts are used for both injecting domain walls as well as shifting them along the nanowire. The preferred methodology of this invention is implemented in nanowires, where the motion of domain walls along a nanowire is induced by electrical current through volume spin torques as opposed to interfacial spin hall torque[1, 18]. In the preferred embodiment, the domain walls are injected, as well as moved in the direction of the electron flow, e.g., using current whose duration is between 1 and 100 nanoseconds. The direction in which the domain walls are injected across the magnetic interface and the direction in which the domain walls move after injection are the same for the specific materials used and disclosed herein. (However, for other materials, the domain walls can be injected/moved in the direction opposite of the electron flow.) For example, in the currently described, preferred embodiment, which uses magnetic nanowire formed from alternating layers of Co and Ni (e.g., a few atomic layers of each may be deposited using any one of a number of ultrahigh vacuum thin film deposition techniques, such as sputtering and molecular beam epitaxy), the current becomes spin-polarized in the majority electron spin direction; however, the current is carried by minority spin polarized electrons in, for example: Cr doped Fe, a conventional magnetic metal; in Mn— doped GaAs, a dilute magnetic semiconductor; in LaSrMnO$_x$, a complex magnetic oxide; and in CrO$_2$, a nominally half-metallic ferromagnet.

In another example, in a magnetic metallic alloy formed from a rare-earth metal (such as Gd and/or Tb) and a 3d transition metal (such as Co and/or Fe), the current will be carried by either majority or minority spin polarized electrons depending on whether the temperature is above or below the compensation temperature. In a further example, the magnetic nanowire may be formed from a Heusler alloy (or compound) such as Co$_2$MnSi, Co$_2$FeAlSi, Mn$_3$, Ga$_x$, and Mn$_{3-x}$Ge$_x$ where x~0.

Figure 3:
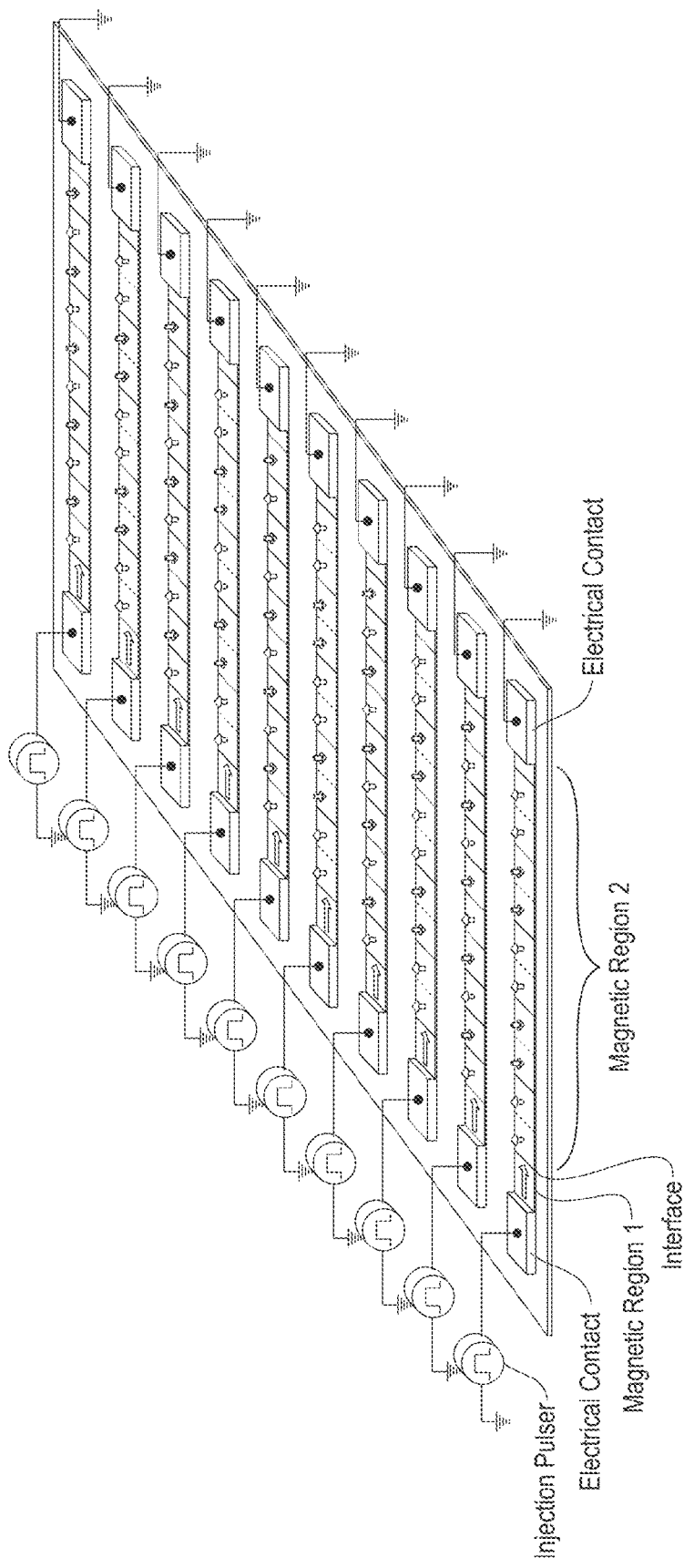
FIG. 3 represents a schematic illustration of the dense racetrack memory architecture made possible by the one-dimensional nature of the in-line injection.

An advantageous aspect of the preferred embodiment is that only one uni-polar current pulser (e.g., any one of a number of commercially available nanosecond pulse generators may be used) is needed for injection and the shifting of domain walls (as shown in FIGS. 2A and 2B), thereby decreasing the complexity of the racetrack memory device. Moreover, the truly one-dimensional nature of the ILI geometry makes the racetrack memory architecture much more simplified and streamlined owing to its smaller footprint (FIG. 3) as compared to conventional designs. In FIG. 3, an array of nanowires is shown, in which each of the nanowires is like the nanowire shown in FIG. 2A or FIG. 2B. Such an array would be useful in the context of a memory storage device.

Figure 4A:
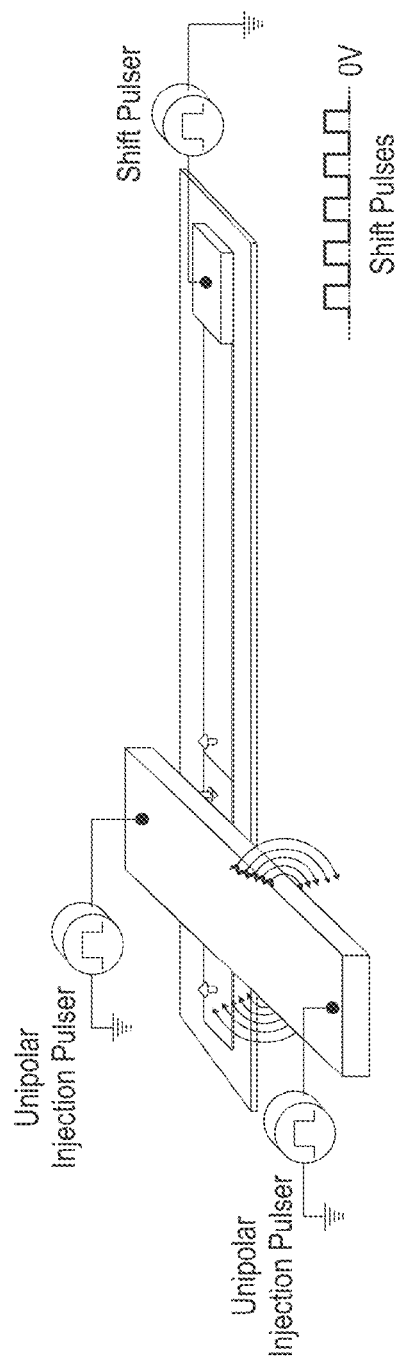
FIGS. 4A and 4B, represents a schematic illustration of the existing field based injection scheme used in the prior art. Domain walls are injected using local magnetic fields generated from a contact line oriented orthogonal to the nanowire underneath.
Figure 4B:
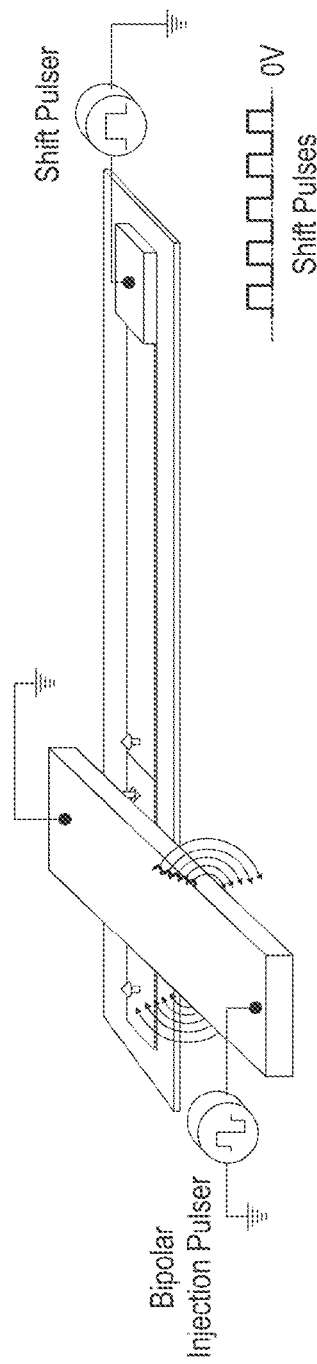

By comparison, the prior art shown in FIG. 4 employs a local magnetic field to inject domain walls into a magnetic nanowire, thereby necessitating more current pulsers in the circuit than are needed in this invention. For instance, two possible configurations for local magnetic field-based injection are shown in FIG. 4, which can be used to inject up/down or down/up oriented domain walls with a local magnetic field and then shift them with spin transfer torque. In the prior art configuration shown in FIG. 4A, uni-polar injection pulsers on either side of the injection line, as well as one shift pulser to shift the domain walls in the racetrack, are needed. Alternatively, in the prior art configuration shown in FIG. 4B, one bi-polar injection pulser and one shift pulser are used. (The prior art configuration shown in FIG. 4A, in principle, could be modified to not use a shift pulser but rather only use two injection pulsers connected on either side of the injection line that delivers negative current pulses into the nanowire, so as to simultaneously shift the domain wall with spin transfer torque upon its creation[19].) In both of the scenarios depicted, at least two injection pulsers are employed.

Figure 5A:
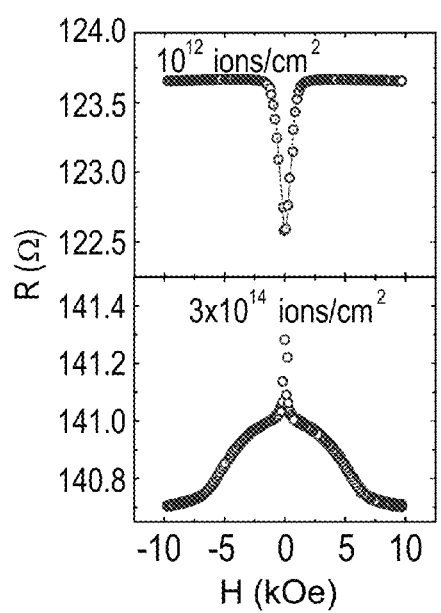
FIG. 5A shows the resistance vs. magnetic field in the hard axis direction (in-plane) for a region irradiated by $10^{12}$ ions/cm$^2$ and resistance vs. magnetic field in the hard axis direction (out-of-plane) for a region irradiated by $3\times10^{14}$ ions/cm$^2$.
Figure 5B:
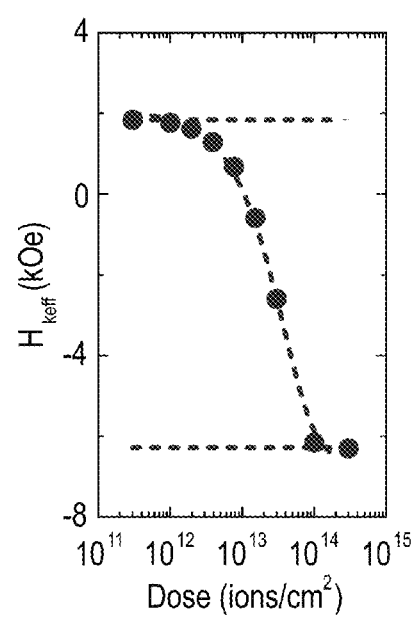
FIG. 5B shows the dependence of the anisotropy field as a function of ion irradiation dose. Positive and negative effective anisotropy values denote out-of-plane and in-plane easy axes, respectively.

Creation of the embodiment discussed above requires appropriately engineering the anisotropy of the magnetic sample. Reduction in the anisotropy is accomplished using ion bombardment in multilayered samples, which were composed of Si(O$_x$)|100 AlO$_x$|50 Ti$_{60}$Ni$_{40}$|3 Co| [7 Ni|1.50 Co]$_6$|50 TaN (the numbers representing the thickness of each layer in Å) grown by magnetron sputtering and annealed at 270° C. for 1 hour to improve their perpendicular magnetic anisotropy (PMA). Annealed samples exhibit square hysteresis loops such that they are fully magnetized out-of-plane at remanence. The PMA of the films was reduced by irradiation with a 20 keV$^+$ Ne ion beam. Owing to the anisotropic magnetoresistance (AMR) effect[20], the anisotropy field H$_{keff}$ can be obtained from the resistance vs. field (R(H)) measurements with the field applied along the anisotropy hard axis (FIG. 5A) for samples with PMA and in-plane magnetic anisotropy (IMA). H$_{keff}$ is determined by fitting the data with a coherent rotation model[21], which also accounts for slight misalignment of the magnetic field with respect to the anisotropy axis. As shown in FIG. 5B, the effective anisotropy constant K$_{eff}$=H$_{keff}$M$_S$/2, where M$_S$ is the saturation magnetization, can be continuously controlled by adjusting the ion irradiation dose. The transition from PMA to IMA was found to occur at a dose of ~10$^{13}$ ions/cm$^2$. The embodiments having the two anisotropy regions (see FIGS. 2 and 3) can be made at minimum lithographic dimensions through the use of ion irradiation. By using the process schematically shown in FIGS. 6A-D, for example, a broad beam ion source was used, as opposed to a focused ion beam system, to soften lithographically defined regions in the magnetic nanowires. Furthermore, it was possible to have these softened regions self-align to contacts placed on top of the nanowire. This process is very suitable for the fabrication of large numbers of nanowires with well-defined anisotropy landscapes.

As shown in FIG. 6A, an opening is created using conventional e-beam lithography onto an e-beam resist (PMMA), which has been deposited on top of a pre-existing nanowire device. Thereupon, a 20 keV Ne$^+$ ion beam is directed off-axis (e.g., by 10 degrees) onto the resist, thereby irradiating the exposed portion of the magnetic nanowire (seen in the lower left hand portion of FIG. 6B) and reducing its anisotropy. The formation of an electrical contact to the nanowire is shown in FIG. 6C, in which, by way of example, a 180 nm thick layer of gold is deposited onto the structure shown in FIG. 6B. The e-beam resist is subsequently removed as part of a lift-off step, as shown in FIG. 6D. Likewise, another electrical contact (not shown) can be formed on the right hand side of the structure shown in FIG. 6D, thereby forming a nanowire like those shown in FIGS. 2 and 3.

Figure 7A:
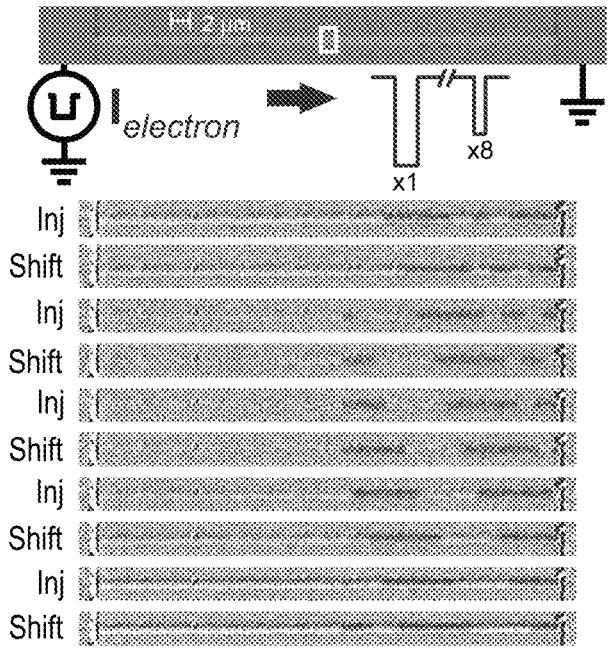
FIGS. 7A and 7B show the optical microscope image of a nanowire device, along with schematics of the circuit and pulse sequences, with polar magneto-optical Kerr effect (MOKE) microscope measurements of domain walls injected by in-line injection in nanowires for negative (FIG. 7A) and positive (FIG. 7B) current pulses.
Figure 7B:
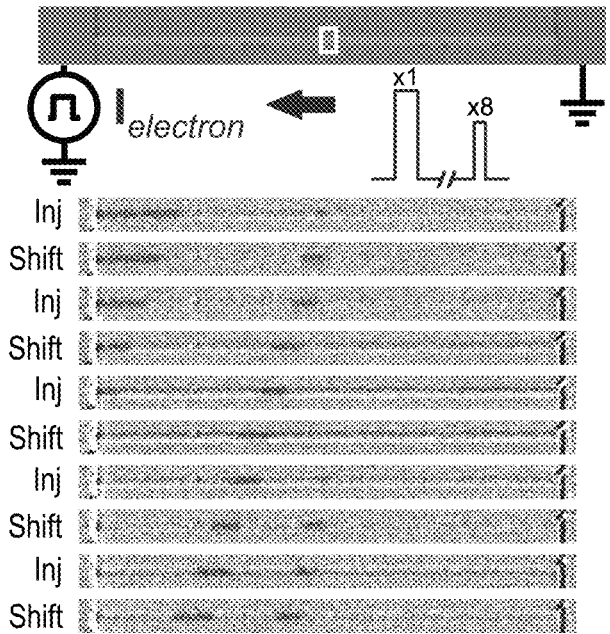

One may also use focused ion beams to create these reduced anisotropy regions, as shown in the nanowire of FIG. 7A, which has been irradiated in its center through the use of a focused ion beam. Other techniques for locally changing the anisotropy include locally depositing a thin in-plane magnetic layer (such as permalloy) locally on top of the nanowire to drive the PMA in-plane through exchange coupling, etching using depth-controlled Ar$^+$ ion etching with patterned etching masks[22], and dynamically through the use of voltage control of the anisotropy[23-24] or via spin polarized currents generated via the SHE in wires, formed from heavy metals such as Pt, Pd or Ir or from Ta or W or from metal layers doped with heavy atoms, that are in proximity to the writing region of the racetrack.

Figure 7C:
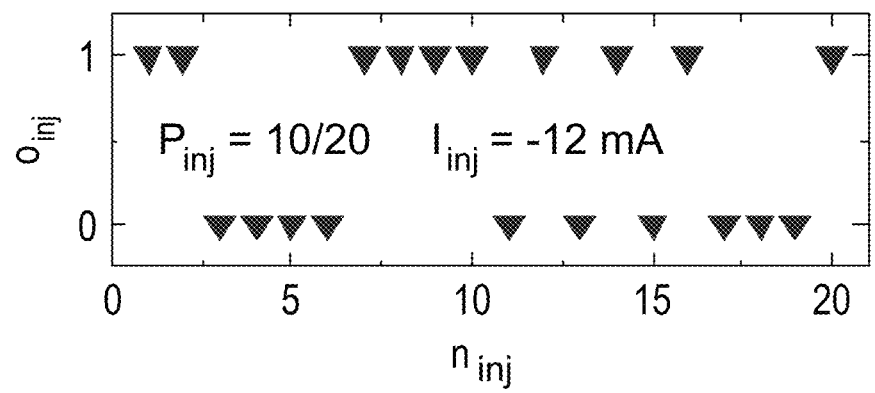
FIGS. 7C and 7D show the occurrence of injection $o_{inj}$ for negative (FIG. 7A) and positive injection pulses (FIG. 7B) as a function of injection pulse number $n_{inj}$.
Figure 7D:
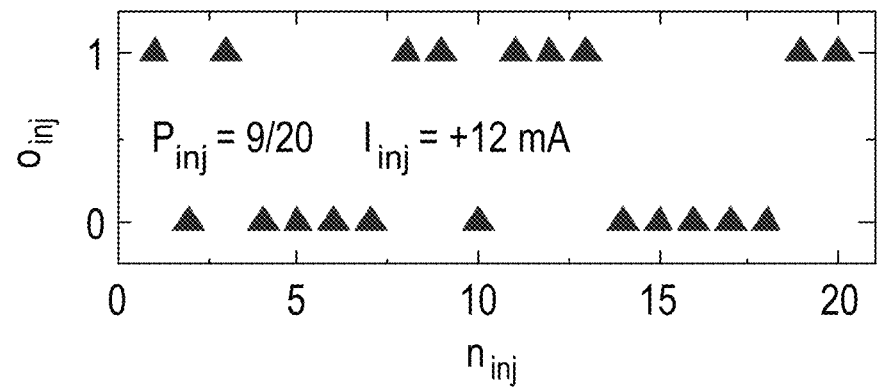

In order to visualize the ILI of domain walls, polar magneto-optical Kerr effect (MOKE) microscopy measurements were performed on nanowires made from a PMA magnetic stack by standard lithography techniques, such as those discussed in connection with FIG. 6. The wire shown in FIGS. 7A and B is 60 μm long and 1 μm wide. The irradiated area created by a Ga$^+$ focused ion beam in the center of the nanowire is 2×3 μm$^2$, and the dose (flux) of the ions corresponds to $10^{14}$ ions/cm$^2$. FIGS. 7A and B show evidence of in-line domain wall injection in the nanowire as five repetitions of 1 injection pulse (12 mA; current density, j~2.9×10$^8$ A/cm$^2$, 50 ns long) followed by 8 propagation pulses (7.9 mA; j~1.9×10$^8$ A/cm$^2$, 25 ns long) are passed along the nanowire. Switching the polarity of the pulse waveform also switches the side of the central injection site where the domain walls get injected into the nanowire. The direction of the domain wall injection is the same as the direction of the electron current, implying that the domain walls get created because of the large spin transfer torque from the electron flow at the 90° magnetization interface, as discussed above. The directionality of domain wall injection also precludes domain wall nucleation due to heating of the nanowire. FIGS. 7C and D summarize the occurrence of domain wall injection, o$_{inj}$ (defined as 1 when a domain wall gets injected and 0 when no domain wall gets injected) as a function of the injection pulse number n$_{inj}$. Note that in each of FIGS. 7C and 7D, the probability of injection (P$_{inj}$) is about 50%.

Figure 8A:
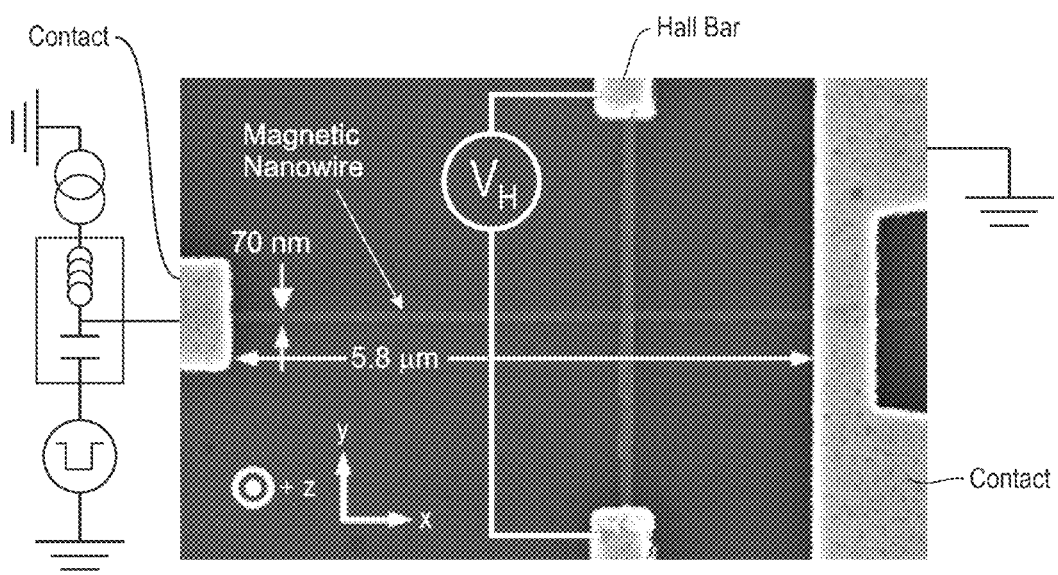
FIG. 8A shows a scanning electron microscope image of the nanowire device and a schematic of the circuit used in an embodiment of this invention. The anomalous Hall effect is used in this case to detect the local magnetization in the magnetic nanowire.

Even though the injection process is rather stochastic in these wide nanowires, it provides a proof-of-concept that domain walls can indeed be injected by spin transfer torque. This stochasticity can be understood from micromagnetic simulations, described below. This understanding can now be applied to explore ILI in much narrower (70 nm wide) nanowires. FIG. 8A shows a scanning electron micrograph (SEM) of a typical device along with a schematic of the circuit used in this invention. First, a 70 nm wide and 8 μm long nanowire is fabricated from a thin film PMA magnetic stack (with effective anisotropy K$_{eff}$=½H$_{keff}$M$_s$~5×10$^5$ erg/cm$^3$, where the effective anisotropy field, H$_{keff}$~2 kOe and M$_s$ is the saturation magnetization; K$_{eff}$>0 corresponds to the easy axis of the magnetization being out-of-plane) by electron beam lithography and Ar$^+$ ion milling. An 80 nm wide TaN Hall bar (30 nm thick) is then patterned on top of the nanowire.

Figure 8B:
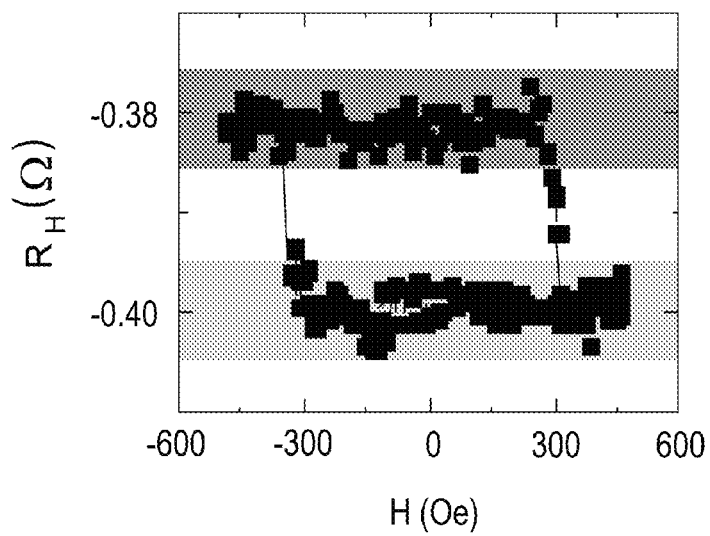
FIG. 8B shows the Hall resistance as a function of magnetic field, with the shaded signals at $R_H \sim -0.38\Omega$ and $R_H \sim -0.40\Omega$ corresponding to downward and upward magnetization states, respectively.
Figure 8C:
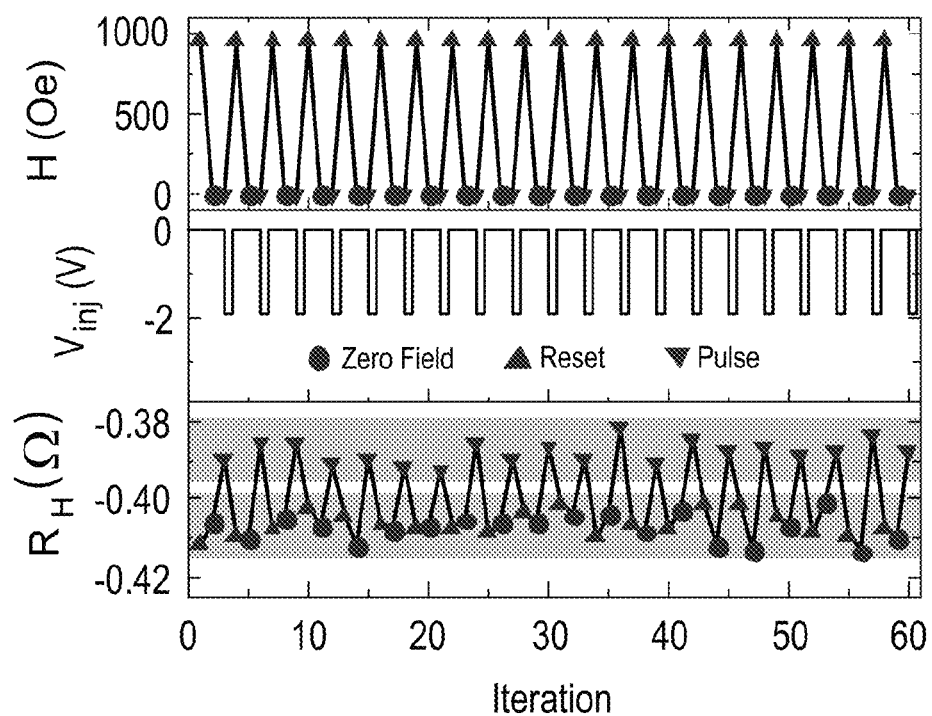
FIG. 8C shows the magnetic field H, Hall resistance $R_H$, and injection voltage $V_{inj}$ with experimental iteration for a nanowire, which is 70 nm wide, where the nanowire is reset with H and a single injection pulse is applied. Upward-pointing triangles denote reset operation, circles signify when the field is brought back to zero, and downward-pointing triangles indicate points during the experiment where pulses are applied along the nanowire.

Due to the limitation of using visible light, polar-MOKE microscopy measurements cannot be performed on such small dimensions. Instead, the anomalous Hall resistance across the Hall bar, R$_H$, which changes between two distinct values depending upon whether the portion of the nanowire beneath the Hall bar is magnetized in the +z or in −z direction (FIG. 8B), is used to study the switching behavior of the nanowire. Note that in order to perform R$_H$ measurements, a current of −200 μA (j~6.3×10$^7$ A/cm$^2$) is continuously passed through the nanowire, which is large enough for a domain wall, once injected, to creep through the nanowire[25]. In order to obtain spin transfer torque for domain wall injection, the irradiated part is not entirely beneath the injection line (see FIGS. 6B, 6C, and 6D), which avoids having all the current short through the thick gold injection line, instead of flowing across the 90° magnetization interface. Remarkably, the probability of domain wall injection in such narrow nanowires (FIGS. 8C and D) is much higher (100%) than that in the wide nanowires studied under the polar-Kerr microscope (FIGS. 7C and D).

Figure 9:
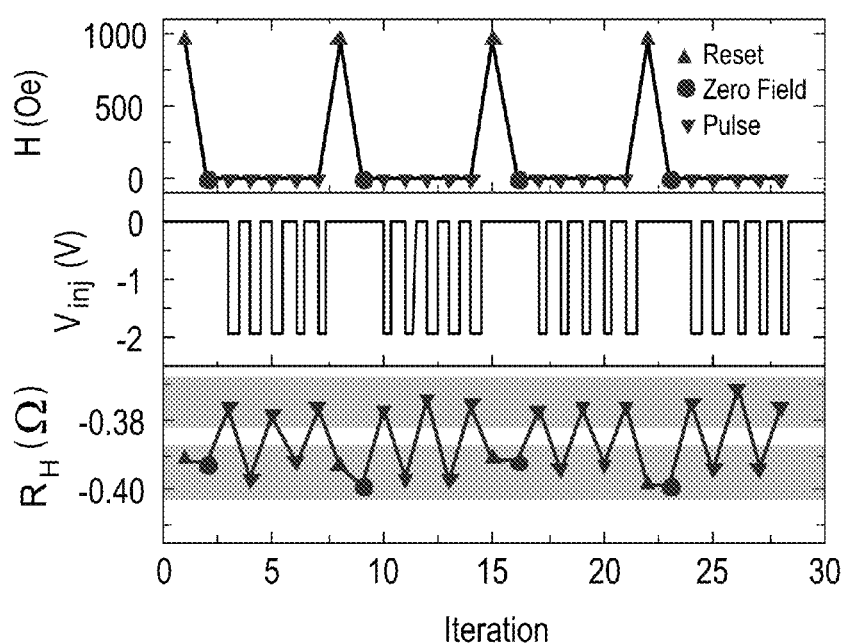
FIG. 9 shows H, $R_H$ and $V_{inj}$ with experimental iteration for the same nanowire as in FIG. 8, showing successive injection of a series of domain walls. Multiple pulses are applied to the nanowire sequentially after each reset operation. $R_H$ is measured after each injection pulse.

Furthermore, it is now experimentally shown that consecutive up/down and down/up domain walls can be continuously injected by ILI (see FIG. 9). In this experiment, the nanowire is first reset by a large field of ~950 Oe, which is turned off before a series of five uni-polar pulses (V$_{inj}$=−1.9 V corresponding to a current of −712 μA, j~−2.2×10$^8$ A/cm$^2$ and pulse width 6 ns) is applied. Remarkably, the domain walls can be injected and shifted out of the nanowire repeatedly by applying the same injection pulse. This is highlighted in FIG. 9, which shows that the Hall bar resistance toggles between high and low levels as up/down and down/up domain walls move past it successively. Applying a pulse of opposite polarity (+2 V) so that the electron current flows in the opposite direction, i.e., from the PMA into the IMA region, does not inject any domain wall in the nanowire. To confirm that domain walls are actually injected at the irradiated site rather than spuriously because of current-induced nucleation, it was also verified that no domain wall injection occurs when current pulses up to −2 V in amplitude and 100 ns in pulse width are applied to a non-irradiated nanowire.

Micromagnetic simulations[26] were performed to elucidate the mechanism based on spin transfer torque for domain wall injection in the ILI scheme. The simulated wire is 3000×70×1 nm$^3$ and the cell size used for the simulation is 5×5×1 nm$^3$. The anisotropy of the nanowire is 1.9×10$^6$ erg/cm$^3$, M$_s$=400 emu/cm$^3$ and A=1.2 μerg/cm. A polarization of 0.4 was used and the non-adiabatic spin torque parameter β=α=0.01, in which α is the Gilbert damping coefficient. The anisotropy is reduced in a 70×70 nm$^2$ sized region at the left hand side of the nanowire to 7.5×10$^5$ erg/cm$^3$, which causes the magnetization in that region of the nanowire to point in-plane, thus forming the writing region.

The relaxed configuration shows a gradient in the magnetization at the 90° magnetization interface due to a combination of the exchange energy and the anisotropies of the two regions. When an electron current is injected from the IMA towards the PMA region, the spin transfer torque given by $$-b_J \vec{m} \times \left( \vec{m} \times \frac{\partial \vec{m}}{\partial \vec{x}} \right)$$

Figure 10A:
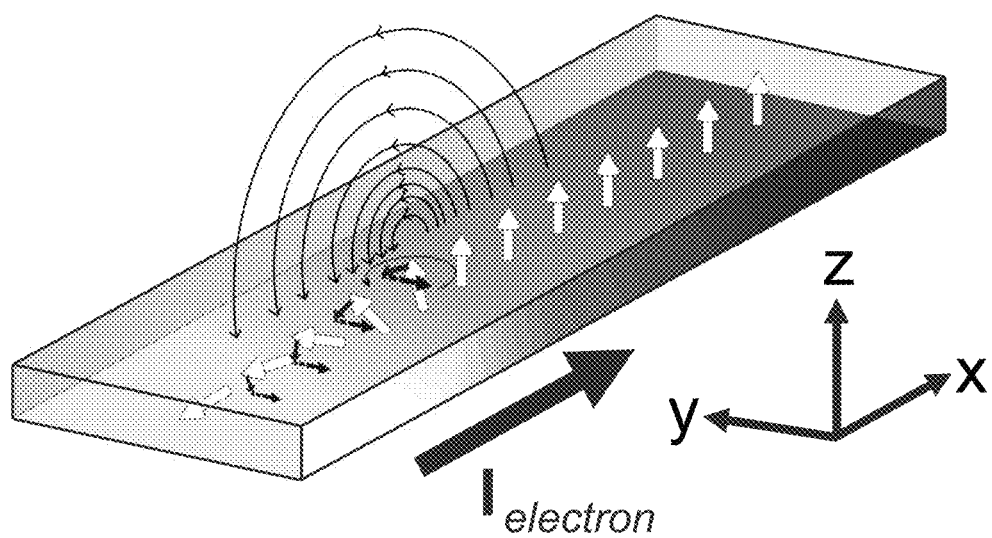
FIG. 10A is a schematic illustration of the magnetization texture (white arrows) near the irradiated section of the magnetic nanowire, showing the 90° magnetization interface thus formed between the in-plane magnetized and out-of-plane magnetized regions. The lines emanating outside of the nanowire denote the fringing fields from the storage region adjacent to the 90° magnetization interface, which act on the in-plane writing region. The darkened arrows in the x-z plane denote the direction of the magnetization rotation due to the spin transfer torque. The darkened arrows in the x-y plane denote the anti-clockwise precession of the magnetization that is caused by the damping torque.

(here, $b_J$ is the adiabatic spin transfer torque coefficient[27] and $\vec{m}$ is the unit vector local moment) is experienced in the direction as shown in FIG. 10A, which causes the local moments to turn in the anti-clockwise direction in the x-z plane. This leads to a damping torque, given by $$\alpha\left(\vec{m} \times \frac{\partial \vec{m}}{\partial t}\right)$$

(again, $\alpha$ is the Gilbert damping coefficient) that causes the magnetization of the IMA region to precess in the x-y plane in the anti-clockwise direction. At the same time, the magnetization of the IMA region picks up a component in the −z direction due to the fringing field from the adjacent PMA region (FIG. 10A). This is why a transient down/up domain wall gets formed, which subsequently gets extracted into the PMA segment (here: the storage region) of the nanowire due to spin transfer torque.

Figure 10B:
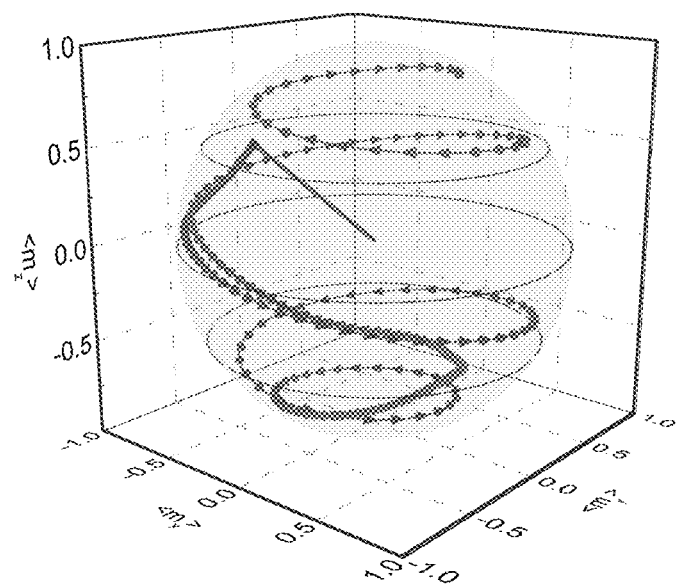
FIG. 10B shows the trajectory of the average magnetization unit vector of the irradiated section of the magnetic nanowire. The initial magnetization has a small +z component due to the exchange interaction with the adjacent out-of-plane magnetized region.
Figure 10C:
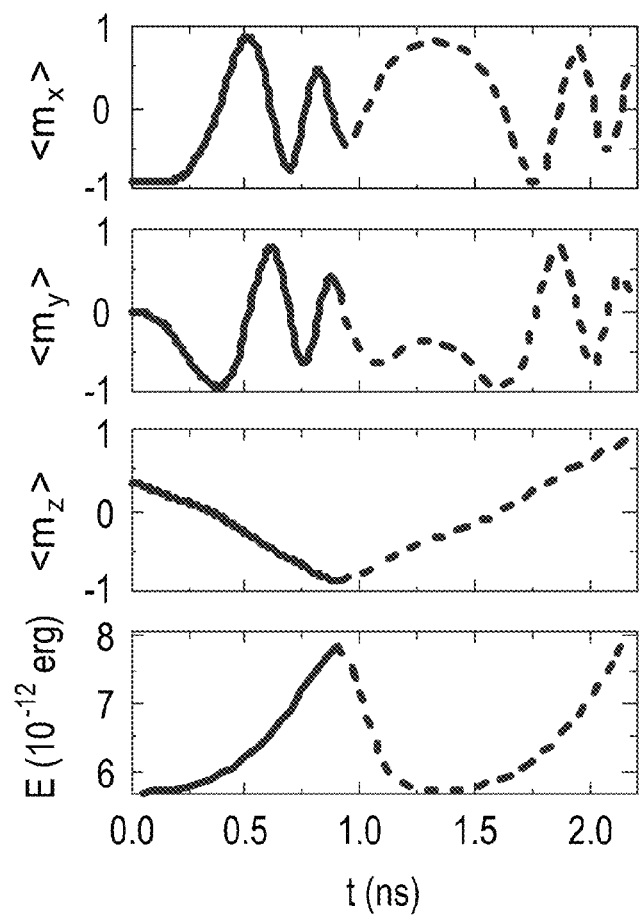
FIG. 10C shows time-resolved evolution of the magnetization components and the internal energy of the irradiated section of the nanowire. The solid line segments denote the magnetization evolution during the formation of a domain oriented towards the −z direction, and the dashed line segments denote the magnetization evolution during the formation of a domain oriented towards the +z direction.
Figure 10D:
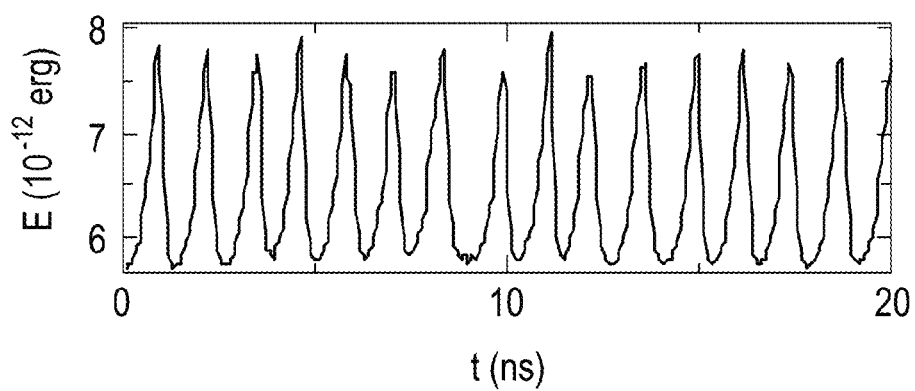
FIG. 10D shows the internal energy change in the irradiated section of the nanowire for longer times. A domain wall is injected into the nanowire when the internal energy of the irradiated portion is maximized.

The time evolution of the various components of magnetization of the irradiated IMA region (FIGS. 10B and C) shows that the domain wall gets extracted after the magnitude of the z-component magnetization and consequently the internal energy of the initially in-plane magnetized irradiated region gets maximized (FIGS. 10C and D). Upon injection of a domain wall, the PMA region next to the 90° magnetization interface switches its orientation, thereby also changing the direction of its fringing field as experienced by the IMA region. It is this reversal of the field direction along with the reversal of the spin transfer torque and damping torques that causes the precession of the IMA region to first slow down and then reverse its direction. Hence, for a constant current that exceeds a threshold value, the IMA region keeps switching its rotation direction (FIG. 10C and FIGS. 11A and B), and after each time the IMA region does so, a domain wall gets injected into the nanowire.

Figure 8D:
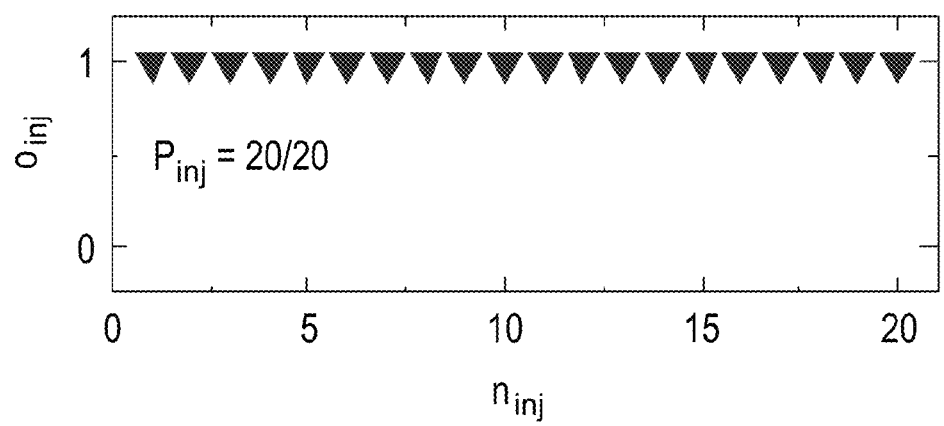
FIG. 8D summarizes the occurrence of injection $o_{inj}$ as a function of $n_{inj}$ for the experimental data shown in FIG. 8C.

The IMA region, being small for such narrow nanowires, is strongly exchange coupled and behaves as a single magnetic entity. However, when the dimensions of the IMA region are much larger than the magnetic exchange length[28], for example in a wider nanowire (FIG. 11C), the in-line domain wall injection process is not as well controlled because multiple domains are formed in the irradiated region. When the size of the IMA region is less than ~100 nm, for the material parameters used here, the IMA region does indeed behave as a single magnetic entity. This accounts for the stochastic injection of domain walls in the wide nanowires (FIGS. 7C and D) as compared to high fidelity injection in narrow nanowires (FIGS. 8D and 9). Thus, the ILI mechanism is expected to be even more reliable for narrower nanowires—a prerequisite for higher data density racetrack memories. Also, note that the Gilbert damping of these films is typically on the order of 0.01. The injection process can be more energy efficient, as the damping gets reduced by, for example, choosing different materials.

For a fixed DC current density above the writing threshold, which is also above the current density for shifting domain walls, the domain walls are continuously injected into the nanowire, with the spacing determined by the magnitude of the DC current. On the other hand, if a series of domain walls already exists in the storage region, application of the DC current in the reverse direction will cause the domain walls to propagate back to the writing region, thereby resetting the nanowire (so that the PMA region has no domain walls). The magnetization of the storage region will be reset, so that it has the same orientation as the magnetization of the domain farthest away from the writing region at the start of the process.

One may also use this DC current to electrically set the nanowire in the reset state without the use of any magnetic fields. This can be accomplished by first setting a part of the storage region that is adjacent to the writing region in the desired magnetic orientation through the use of a current pulse of the correct magnitude along the nanowire. The magnitude and temporal length of this pulse is too small to create more than one domain wall in the storage region. Next, a current smaller than the threshold for domain wall injection is flowed into the device so that the domain walls are shifted out away from the writing region. Because the current for moving domain walls is smaller than that required for injecting domain walls, no new domain walls will be injected, and the ones in the nanowire will be shifted out of the nanowire away from the writing region, leaving the magnetization of the nanowire with the same orientation as that of the region next to the writing region at the start of the process.

The application of a DC current above the threshold for domain wall injection through the nanowire causes a continuous stream of domain walls to be injected into the nanowire. However, the spacing between the domain walls is fixed for a given DC current density, and so the encoded data stream is also fixed. Introduction of arbitrary domain patterns or information streams in the nanowire requires the use of pulsed DC currents, whereby the magnitude, pulse length, and number of the current pulses used for injecting the domain walls sets the magnetization pattern that is written into the nanowire.

The invention may be embodied in other specific forms without departing from its spirit or essential characteristics. The described embodiments are to be considered in all respects only as illustrative and not restrictive. The scope of the invention is therefore indicated by the appended claims rather than the foregoing description. All changes within the meaning and range of equivalency of the claims are to be embraced within that scope.

(1) Ryu, K.-S.; Thomas, L.; Yang, S.-H.; Parkin, S., Chiral spin torque at magnetic domain walls. *Nat Nano* 2013, 8 (7), 527-533.

(2) Ryu, K.-S.; Yang, S.-H.; Thomas, L.; Parkin, S. S. P., Chiral spin torque arising from proximity-induced magnetization. *Nat Commun* 2014, 5.

(3) Shigeto, K.; Shinjo, T.; Ono, T., Injection of a magnetic domain wall into a submicron magnetic wire. *Appl. Phys. Lett.* 1999, 75 (18), 2815-2817.

(4) Cowburn, R. P.; Allwood, D. A.; Xiong, G.; Cooke, M. D., Domain wall injection and propagation in planar Permalloy nanowires. *J. Appl. Phys.* 2002, 91, 6949-6951.

(5) Thomas, L.; Rettner, C.; Hayashi, M.; Samant, M. G.; Parkin, S. S. P.; Doran, A.; Scholl, A., Observation of injection and pinning of domain walls in magnetic nanowires using photoemission electron microscopy. *Appl. Phys. Lett.* 2005, 87 (26), 262501.

(6) Beach, G. S. D.; Nistor, C.; Knutson, C.; Tsoi, M.; Erskine, J. L., Dynamics of field-driven domain-wall propagation in ferromagnetic nanowires. *Nature Materials* 2005, 4 (10), 741-744.

(7) Atkinson, D.; Allwood, D. A.; Xiong, G.; Cooke, M. D.; Faulkner, C. C.; Cowburn, R. P., Magnetic domain-wall dynamics in a submicrometre ferromagnetic structure. *Nature Materials* 2003, 2 (2), 85-87.

(8) Hayashi, M.; Thomas, L.; Bazaliy, Y. B.; Rettner, C.; Moriya, R.; Jiang, X.; Parkin, S. S. P., Influence of current on field-driven domain wall motion in permalloy nanowires from time resolved measurements of anisotropic magnetoresistance. *Phys. Rev. Lett.* 2006, 96 (19), 197207.

(9) Hayashi, M.; Thomas, L.; Rettner, C.; Moriya, R.; Parkin, S. S. P., Direct observation of the coherent precession of magnetic domain walls propagating along permalloy nanowires. *Nature Phys.* 2007, 3, 21-25.

(10) Klaui, M.; Vaz, C. A. F.; Bland, J. A. C.; Wernsdorfer, W.; Faini, G.; Cambril, E.; Heyderman, L. J.; Nolting, F.; Rudiger, U., Controlled and Reproducible Domain Wall Displacement by Current Pulses Injected into Ferromagnetic Ring Structures. *Phys. Rev. Lett.* 2005, 94 (10), 106601.

(11) Grollier, J.; Boulenc, P.; Cros, V.; Hamzic, A.; Vaures, A.; Fert, A.; Faith, G., Switching a spin valve back and forth by current-induced domain wall motion. *Appl. Phys. Lett.* 2003, 83 (3), 509-511.

(12) Thomas, L.; Hayashi, M.; Jiang, X.; Moriya, R.; Rettner, C.; Parkin, S. S. P., Oscillatory dependence of current-driven magnetic domain wall motion on current pulse length. *Nature* 2006, 443, 197.

(13) Yamaguchi, A.; Ono, T.; Nasu, S.; Miyake, K.; Mibu, K.; Shinjo, T., Real-Space Observation of Current-Driven Domain Wall Motion in Submicron Magnetic Wires. *Phys. Rev. Lett.* 2004, 92 (7), 077205.

(14) Allwood, D. A.; Xiong, G.; Faulkner, C. C.; Atkinson, D.; Petit, D.; Cowburn, R. P., Magnetic domain-wall logic. *Science* 2005, 309 (5741), 1688-1692.

(15) Pushp, A.; Phung, T.; Rettner, C.; Hughes, B. P.; Yang, S.-H.; Thomas, L.; Parkin, S. S. P., Domain wall trajectory determined by its fractional topological edge defects. *Nat Phys* 2013, 9 (8), 505-511.

(16) Parkin, S. S. P.; Hayashi, M.; Thomas, L., Magnetic Domain-Wall Racetrack Memory. *Science* 2008, 320 (5873), 190-194.

(17) West, A. D.; Weatherill, K. J.; Hayward, T. J.; Fry, P. W.; Schrefl, T.; Gibbs, M. R. J.; Adams, C. S.; Allwood, D. A.; Hughes, I. G., Realization of the Manipulation of Ultracold Atoms with a Reconfigurable Nanomagnetic System of Domain Walls. *Nano Letters* 2012, 12 (8), 4065-4069.

(18) Emori, S.; Bauer, U.; Ahn, S.-M.; Martinez, E.; Beach, G. S. D., Current-driven dynamics of chiral ferromagnetic domain walls. *Nat Mater* 2013, 12 (7), 611-616.

(19) Hayashi, M.; Thomas, L.; Moriya, R.; Rettner, C.; Parkin, S. S. P., Current-Controlled Magnetic Domain-Wall Nanowire Shift Register. *Science* 2008, 320 (5873), 209-211.

(20) McGuire, T. R.; Potter, R. I., Anisotropic Magnetoresistance in Ferromagnetic 3d Alloys. *Ieee Transactions on Magnetics* 1975, 11 (4), 1018-1038.

(21) Stoner, E. C.; Wohlfarth, E. P., A Mechanism of Magnetic Hysteresis in Heterogeneous Alloys. *Philosophical Transactions of the Royal Society of London. Series A, Mathematical and Physical Sciences* 1948, 240 (826), 599-642.

(22) Hayashi, M.; Yamanouchi, M.; Fukami, S.; Sinha, J.; Mitani, S.; Ohno, H., Spatial control of magnetic anisotropy for current induced domain wall injection in perpendicularly magnetized CoFeB|MgO nanostructures. *Appl. Phys. Lett.* 2012, 100 (19), 192411-4.

(23) Shiota, Y.; Nozaki, T.; Bonell, F.; Murakami, S.; Shinjo, T.; Suzuki, Y., Induction of coherent magnetization switching in a few atomic layers of FeCo using voltage pulses. *Nat. Mater.* 2012, 11 (1), 39-43.

(24) Wang, W.-G.; Li, M.; Hageman, S.; Chien, C. L., Electric-field-assisted switching in magnetic tunnel junctions. *Nat. Mater.* 2012, 11 (1), 64-68.

(25) Metaxas, P. J.; Jamet, J. P.; Mougin, A.; Cormier, M.; Ferré, J.; Baltz, V.; Rodmacq, B.; Dieny, B.; Stamps, R. L., Creep and Flow Regimes of Magnetic Domain-Wall Motion in Ultrathin Pt/Co/Pt Films with Perpendicular Anisotropy. *Phys. Rev. Lett.* 2007, 99 (21), 217208.

(26) Scheinfein, M. R., LLG Micromagnetics Simulator. *LLG Micromagnetics Simulator.*

(27) Zhang, S.; Li, Z., Roles of nonequilibrium conduction electrons on the magnetization dynamics of ferromagnets. *Phys. Rev. Lett.* 2004, 93 (12), 127204.

(28) Hubert, A.; Schäfer, R., *Magnetic Domains*. Springer-Verlag: Berlin, 2000.

The invention claimed is:

1. A method, comprising:
   injecting spin-polarized charge current across an interface between a first magnetic region and an adjoining, second magnetic region, thereby creating in the second magnetic region new domain walls that separate respective magnetic domains, wherein the first and second magnetic regions have non-collinear magnetizations; and
   detecting the orientation of the magnetization of the domains.

2. The method of claim 1, wherein a series of magnetic domain walls is created in the second magnetic region corresponding to data that are subsequently read out.

3. The method of claim 2, wherein the domain walls have a spatial separation determined by the magnitude of the current.

4. The method of claim 3, wherein the current includes current pulses.

5. The method of claim 4, wherein the current exceeds a threshold value below which domain walls are not injected into the second magnetic region.

6. The method of claim 5, wherein current below the threshold value is used to reset the second magnetic region to a state having no domain walls therein.

7. The method of claim 1, wherein the current has a duration of between 1 and 100 nanoseconds, the current being used to inject a preselected number of domain walls that is proportional to the duration of the current.

8. The method of claim 1, wherein said creating relies on a combination of (i) innate fringing fields from the first and second magnetic regions and (ii) spin-transfer torque derived from the current as it flows across the interface.

9. The method of claim 1, wherein the magnetization direction of the first magnetic region is perpendicular to that of the second magnetic region.

10. The method of claim 1, wherein the first and second magnetic regions together define a nanowire that is part of a racetrack memory device.

11. The method of claim 10, wherein the magnetization of the first magnetic region is parallel to a plane defined by the length and the width of the nanowire.

12. The method of claim 10, wherein the magnetization of the second magnetic region is perpendicular to a plane defined by the length and the width of the nanowire.

13. The method of claim 10, the nanowire has a width of less than 100 nm.

14. The method of claim 1, wherein the second magnetic region is formed from one or more layers of Co and Ni.

15. The method of claim 1, wherein the first magnetic region is formed from one or more layers of Co and Ni.

16. The method of claim 1, wherein the first magnetic region is located at one end of a magnetic racetrack device.

17. The method of claim 1, wherein the first and second magnetic regions have a Gilbert damping value below 0.01.

18. The method of claim 1, wherein the first and second magnetic regions are initially formed from the same material.

19. The method of claim 18, wherein the first magnetic region is formed by ion bombardment of a magnetized region whose magnetization is initially perpendicular to the orientation of the magnetized region.

20. The method of claim 19, wherein the ions are selected from the group consisting of He+, Ar+, Ga+, and Ne+.

21. A method, comprising:
 injecting spin-polarized charge current into a nanowire having a width of less than 100 nm, the nanowire including a first magnetic region that adjoins a second magnetic region, the first magnetic region and the second magnetic region having (i) non-collinear magnetizations and (ii) innate fringing fields;
 creating domain walls in the second magnetic region by using spin-transfer torque derived from the current as electrons flow from the first magnetic region into the second magnetic region, wherein domains defined by the domain walls represent data; and
 reading out the data by detecting the orientation of the magnetization of the domains.

22. The method of claim 21, wherein a series of magnetic domain walls is created in the second magnetic region corresponding to data that are subsequently read out.

23. The method of claim 21, wherein the domain walls have a spatial separation determined by the magnitude of the current.

24. The method of claim 21, wherein the nanowire is part of a racetrack memory device.

25. The method of claim 21, wherein the second magnetic region is formed from one or more layers of Co and Ni.

26. The method of claim 21, wherein the first magnetic region is formed from one or more layers of Co and Ni.

27. The method of claim 21, wherein the first magnetic region is located at one end of a magnetic racetrack device.

* * * * *